United States Patent
Khurana

(10) Patent No.: US 9,390,486 B2
(45) Date of Patent: Jul. 12, 2016

(54) SYSTEM AND METHOD FOR AUTOMATIC ORIENTATION OF A CHIP TO THE CAD LAYOUT WITH SUB-OPTICAL RESOLUTION

(76) Inventor: Neeraj Khurana, Monte Sereno, CA (US)

(*) Notice: Subject to any disclaimer, the term of this patent is extended or adjusted under 35 U.S.C. 154(b) by 1251 days.

(21) Appl. No.: 13/243,804

(22) Filed: Sep. 23, 2011

(65) Prior Publication Data

US 2012/0076395 A1 Mar. 29, 2012

Related U.S. Application Data

(60) Provisional application No. 61/387,872, filed on Sep. 29, 2010.

(51) Int. Cl.
*G06K 9/00* (2006.01)
*G06T 5/50* (2006.01)

(52) U.S. Cl.
CPC ......... *G06T 5/50* (2013.01); *G06T 2207/20221* (2013.01); *G06T 2207/20224* (2013.01)

(58) Field of Classification Search
None
See application file for complete search history.

(56) References Cited

U.S. PATENT DOCUMENTS

| | | | |
|---|---|---|---|
| 5,055,668 A | 10/1991 | French | |
| 5,208,648 A | 5/1993 | Batchelder et al. | |
| 5,220,403 A | 6/1993 | Batchelder et al. | |
| 5,940,545 A | 8/1999 | Kash et al. | |
| 6,064,759 A | 5/2000 | Buckley et al. | |
| 6,504,957 B2 | 1/2003 | Nguyen et al. | |
| 7,187,438 B2 | 3/2007 | Hamamatsu et al. | |
| 7,439,730 B2 | 10/2008 | Desplats et al. | |
| 7,636,155 B2 | 12/2009 | Khurana | |
| 7,792,351 B1 | 9/2010 | Toth et al. | |
| 8,072,589 B2 | 12/2011 | Khurana | |
| 2004/0057610 A1* | 3/2004 | Filseth et al. | 382/144 |
| 2004/0150813 A1 | 8/2004 | Kim et al. | |
| 2004/0240723 A1* | 12/2004 | Sakai et al. | 382/141 |
| 2005/0195396 A1 | 9/2005 | Ono et al. | |
| 2006/0288325 A1 | 12/2006 | Miyamoto et al. | |

(Continued)

FOREIGN PATENT DOCUMENTS

DE 102009044737 A1 6/2010
JP 6-194407 A 7/1994

(Continued)

OTHER PUBLICATIONS

Black, A. et al., "Optical Sampling of GHz Charge Density Modulation in Silicon Bipolar Junction Transistors," Electronics Letter, 1987, vol. 23, No. 15, pp. 783-784.

(Continued)

*Primary Examiner* — Sumati Lefkowitz
*Assistant Examiner* — David Perlman
(74) *Attorney, Agent, or Firm* — Nixon Peabody LLP; Joseph Bach, Esq.

(57) ABSTRACT

A method and system for aligning a DUT image for testing. The alignment is performed by obtaining an optical image of the DUT from an optical system; obtaining a computer aided design (CAD) data having CAD layers of the DUT; constructing a CAD image of the DUT by overlaying the CAD layers; operating on the CAD image to generate a synthetic image simulating an optical image of the DUT; generating a difference image by comparing the optical image to the synthetic image; and, varying parameters of the synthetic image so as to minimize the difference image.

16 Claims, 4 Drawing Sheets

(56) References Cited

U.S. PATENT DOCUMENTS

| | | | |
|---|---|---|---|
| 2007/0156379 A1* | 7/2007 | Kulkarni et al. | 703/14 |
| 2007/0172111 A1* | 7/2007 | Ikeda | 382/149 |
| 2008/0260234 A1* | 10/2008 | Yamashita | 382/144 |
| 2009/0150098 A1 | 6/2009 | Khurana | |
| 2009/0238441 A1* | 9/2009 | Yamashita | 382/144 |
| 2011/0016443 A1* | 1/2011 | Fu et al. | 716/108 |

FOREIGN PATENT DOCUMENTS

| | | |
|---|---|---|
| JP | 08-86841 A | 4/1996 |
| JP | 2001-194323 A | 7/2001 |
| JP | 2001-319955 A | 11/2001 |
| JP | 2002-340789 A | 11/2002 |
| JP | 2003-255231 A | 9/2003 |
| JP | 2004-045132 A | 2/2004 |
| JP | 2005-195403 A | 7/2005 |
| JP | 2005-292016 A | 10/2005 |
| JP | 2008-040370 A | 2/2008 |
| JP | 2008-040705 A | 2/2008 |
| JP | 2009-229159 A | 10/2009 |
| JP | 2010-133958 A | 6/2010 |
| JP | 2014-503787 A | 2/2014 |
| TW | I435070 B | 4/2014 |
| WO | 2006/049243 A1 | 5/2006 |
| WO | 2012/047730 A1 | 4/2012 |

OTHER PUBLICATIONS

Bockelman, D. R. et al., "Infrared Emission-Based Static Logic State Imaging on Advanced Silicon Technologies," Proceedings from the 28th International Symposium for Testing and Failure Analysis, Nov. 3-7, 2002, pp. 531-537.

Bruce, M. et al., "Waveform Acquisition from the Backside of Silicon Using Electro-Optic Probing," Proceedings from the 25th International Symposium for Testing and Failure Analysis, Nov. 14-18, 1999, pp. 19-25.

Heinrich, H. K. et al., "Erratum: Noninvasive Sheet Charge Density Probe for Integrated Silicon Devices," Appl. Phys. Lett., vol. 48, (1066), 1986, pp. 1811-1812.

Heinrich, H. K. et al., "Measurement of Real-Time Digital Signals in a Silicon Bipolar Junction Transistor Using a Noninvasive Optical Probe," IEEE Electronics Letters, vol. 22, No. 12, Jun. 5, 1986, pp. 650-652.

Heinrich, H. K. et al., "Noninvasive Sheet Charge Density Probe for Integrated Silicon Devices," Appl. Phys. Lett. vol. 48, No. 16, Apr. 21, 1986, pp. 1066-1068.

Heinrich, H. K., "Picosecond Noninvasive Optical Detection of Internal Electrical Signals in Flip-Chip-Mounted Silicon Integrated Circuits," IBM J. Res. Development, vol. 34, No. 2/3, Mar./May 1990, pp. 162-172.

Hemenway, B. R. et al., "Optical Detection of Charge Modulation in Silicon Integrated Circuits Using a Multimode Laser-Diode Probe," IEEE Electron Device Letters, vol. EDL-8, No. 8, Aug. 1987, pp. 344-346.

Kasapi, S. et al., "Laser Beam Backside Probing of CMOS Integrated Circuits,"Microelectronics Reliability, vol. 39, 1999, pp. 957-961.

Kolachina, S. et al., "Optical Waveform Probing—Strategies for Non-Flipchip Devices and Other Applications," International Symposium for Testing and Failure Analysis (ISFTA), 2001, pp. 51-57.

Soref, R. A. et al., "Electrooptical Effects in Silicon," IEEE Journal of Quantum Electronics, vol. QE-23 No. 1., Jan. 1987, pp. 13-129.

Wilsher, K. et al., "Integrated Circuit Waveform Probing Using Optical Phase Shift Detection," Proceedings from the 26th International Symposium for Testing and Failure Analysis, Nov. 12-16, 2000, pp. 479-485.

Yee, W. M. et al., "Laser Voltage Probe (LVP): A Novel Optical Probing Technology for Flip-Chip Packaged Microprocessors," International Symposium for Testing and Failure Analysis (ISFTA), 2000, pp. 3-8.

International Search Report and Written Opinion in PCT Application No. PCT/US11/054087, mailed Jan. 20, 2012.

Extended Search Report for European Patent Application No. 11831351.9 dated Sep. 26, 2013.

Examination Report for European Patent Application No. 11831351.9 dated Mar. 5, 2014.

International Preliminary Report on Patentability for PCT/US2011/054087 dated Apr. 11, 2013.

Office Action for U.S. Appl. No. 12/326,859 dated Mar. 21, 2011.

Notice of Allowance for U.S. Appl. No. 12/326,859 dated Jul. 6, 2011.

Notice of Allowance for Taiwanese Patent Application No. 98141051 dated Jan. 7, 2014.

Examination Report for Taiwanese Patent Application No. 98141051 dated Aug. 28, 2013.

Notice of Reasons for Rejections for Japanese Patent Application No. 2009-274367 dated Jun. 24, 2014.

Notice of Reasons for Rejections for Japanese Patent Application No. 2009-274367 dated Jun. 4, 2013.

Notice of Reasons for Refusal for Japanese Patent Application No. 2013-531888 dated Jul. 14, 2015.

Notice of Reasons for Rejections for Japanese Patent Application No. 2014-213405 dated Sep. 15, 2015.

Mack, C.A., "PROLITH: a comprehensive optical lithography model," SPIE Proceedings vol. 0538: Optical Microlithography IV, Jul. 23, 1985, pp. 207-220.

Decision of Refusal for Japanese Patent Application No. 2013-531888 dated Mar. 15, 2016.

* cited by examiner

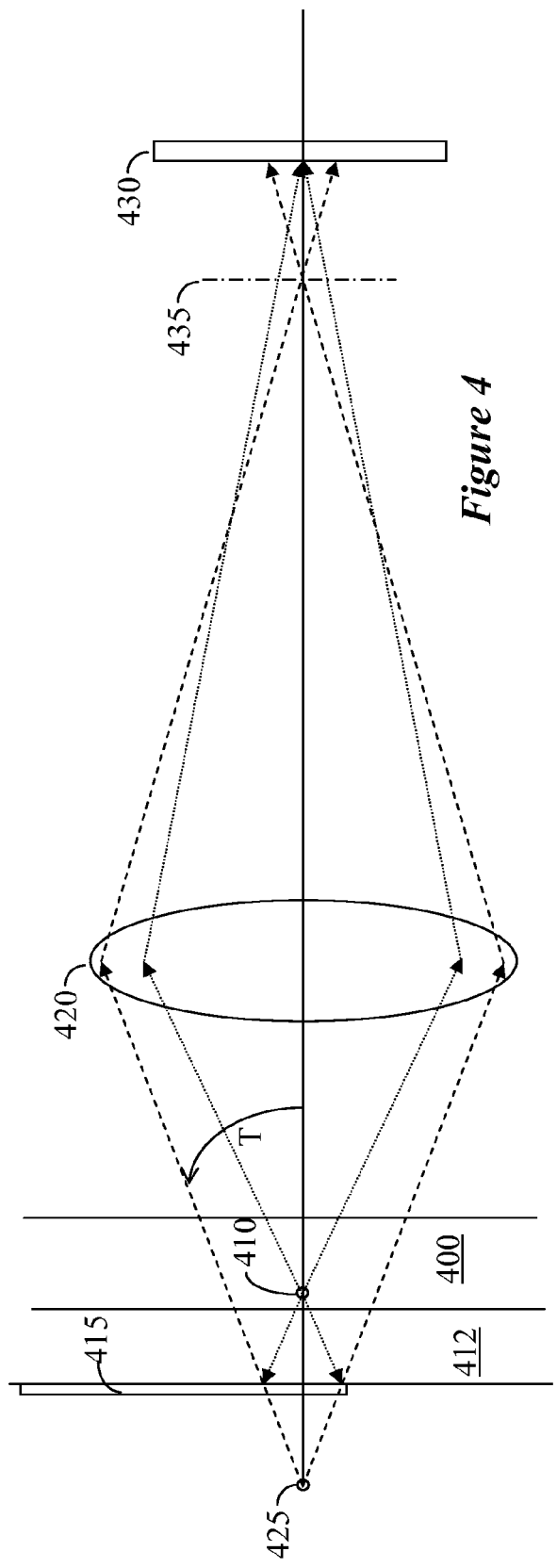
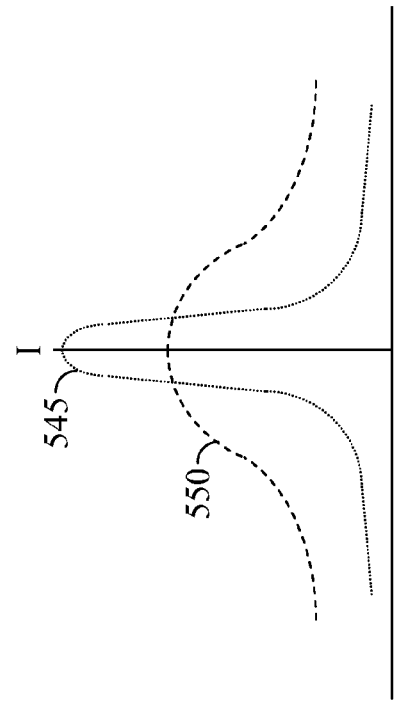
Figure 4
Figure 5

SYSTEM AND METHOD FOR AUTOMATIC ORIENTATION OF A CHIP TO THE CAD LAYOUT WITH SUB-OPTICAL RESOLUTION

RELATED APPLICATIONS

This Application claims priority benefit from U.S. Provisional Application Ser. No. 61/387,872, filed on Sep. 29, 2010, the disclosure of which is incorporated herein by reference in its entirety.

BACKGROUND

1. Field of the Application

The subject application relates to test and debug of semiconductor chips and, more specifically, for orientation/alignment of a chip image to enable test and debug, such as, e.g., testing using device photoemission.

2. Related Art

It has been well known in the art that semiconductor devices emit light upon change of states, e.g. transistors switching on/off. This phenomenon has been used successively to test and debug semiconductor circuits using, e.g., infrared emission microscopy (IREM) and time-resolved emission microscopy. It has also been known in the art to use lasers to test and debug semiconductor circuits by examining modulations in the reflected laser light. The technique is generally referred to as LP (laser probing). Also, with the shrinking of the size of new devices, the devices are made "leaky" so that electron-hole recombination occurs during the static off state of the device, leading to IR emission. This emission increases as design rule decreases. That is, this phenomenon will express itself more pronouncedly as device generation progresses. This static emission can also be used for debug and test of semiconductor circuits.

As can be understood, beneficial use of the emission detection techniques can only be made if the location of the emission can be isolated and accurately linked to the devices that emit the light. Similar issue applies to laser-based systems, i.e., to use such tester one must resolve which device caused the modulation in the reflected laser light. However, as design rule shrinks, the density of the devices increases, making it very difficult and sometimes impossible to isolate the device that emits the light or modulates the laser beam. Additionally, emissions from neighboring devices enter the optical path of the testing system, thereby further complicating the task of isolating the emitting or modulating device. Incidentally, while design rule shrinking leads to improved static emission, it also makes it more difficult to isolate the emitting devices.

Alignment of the CAD design to the chip features is increasingly becoming very difficult as the chip geometries have shrunk below the optical resolution limit. Conventionally the user selects three or more points on the chip CAD design and makes a rough guesses where the same points lie on the blurry chip image, which is acquired by illuminating the chip. The procedure computes the six value Translation Matrix which allows one to map from the CAD space to the chip space to account for X, Y, Theta mis-registration and to correct for mechanical distortion caused on the chip by mechanical and thermal stresses. However the accuracy of this method is now limited by the optical resolution limit. These issues are discussed in U.S. Pat. No. 7,636,155 which discloses method capable of extreme sub-optical resolution of photon emitting transistor if the CAD and the chip are aligned perfectly. But it needs extremely accurate alignment of CAD geometry to the actual transistor on a chip. To resolve photo emissions with double the optical resolution requires a registration accuracy of one fourth the optical resolution limits.

In the above mentioned patent the photoemission could be accurately aligned by aligning the centroid of the photoemission of an isolated transistor to the centre of the CAD geometry of the transistor. However in practice isolated photoemission sites are not always available. For the newer small geometry transistors, the photoemission from different transistors begins to overlap. For multiple overlapping emissions, the centroid of the photoemission will lie somewhere inside the polygon defined by the centre of the emitting transistors. The accuracy of the alignment by this approach becomes unacceptable.

In order to enable progress in the semiconductor industry pursuant to "Moore's Law," designers will continue to decrease design rules and increase device density. Therefore, the need for debug and testing becomes increasingly indispensable and the difficulty of resolving emitting/modulating devices must be solved. Accordingly, there is a need in the art to provide improved resolution of devices on the tested chip, thereby requiring an improved approach to alignment of the chip image.

Another problem in the art is that each emitting transistor is a point-source omni-radiator, meaning it emits light in all directions. Consequently, on various situations it happens that the light is radiated in a direction towards the interconnects, is then reflected by a metal line, and is then propagated through the silicon layer and is collected by the objective lens. Under such circumstances it is difficult to determine where the emission has originated from in order to resolve the emitting devices. Therefore, an improvement is needed to enable resolving the emitting devices even in devices where metal line reflect the emission.

SUMMARY

The following summary is included in order to provide a basic understanding of some aspects and features of the disclosure. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Embodiments of the invention enable improved capability for aligning an optical image of the device under test (DUT) to the CAD design. According to various aspects and embodiments, the CAD design files are used to construct a synthetic image of the chip. The synthetic image is constructed by constructing a synthetic image of each CAD layer and then overlaying all of the CAD layers. Then, hidden layers are removed, and the edges of transparent layers are indicated. The alignment parameters and brightness of each layer are adjusted to achieve best alignment to the actual image of the DUT. According to various aspects and embodiments, an optical spread function is applied to each layer of the synthetic CAD image to simulate off focus blurring. According to various aspects and embodiments, the relative brightness of each layer is determined beforehand and/or max/min boundary variations are calculated for each layer. The relative brightness and boundaries may be normalized to the brightest layer, e.g., metal lines.

Embodiments of the invention provide a method and system for aligning a DUT image for testing. The alignment is performed by obtaining an optical image of the DUT from an optical system; obtaining a computer aided design (CAD)

data having CAD layers of the DUT; constructing a CAD image of the DUT by overlaying the CAD layers; operating on the CAD image to generate a synthetic image simulating an optical image of the DUT; generating a difference image by comparing the optical image to the synthetic image; and, varying parameters of the synthetic image so as to minimize the difference image.

According to disclosed aspects, a method for resolving an emission image of a device under test (DUT) using a computing system is provided, comprising: obtaining a computer aided design (CAD) data having CAD layers of the DUT; selecting an area of the DUT to be resolved; for each active device in the selected area calculating a metal line emission reflection; and, applying attenuation to each calculated metal line emission reflection.

According to further disclosed aspects, a system for orienting an image of a device under test (DUT) is disclosed, comprising: means for obtaining an optical image of the DUT from an optical system; means obtaining a computer aided design (CAD) data having CAD layers of the DUT; a computational engine for constructing a synthetic image of the DUT by overlaying the CAD layers and applying optical system modeling; a comparator generating a difference image by comparing the optical image to the synthetic image; an aligner for iteratively modifying parameters of the synthetic engine to minimize the difference image; and, a decision module for deciding on the proper alignment of the synthetic image to the optical image.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify various embodiments and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements and are, therefore, not drawn to scale.

FIG. 4 illustrate example of ray-tracing to enable understanding of the metal line reflection modeling.

FIG. 5 illustrates a plot of intensity curves.

DETAILED DESCRIPTION

Figure 1:
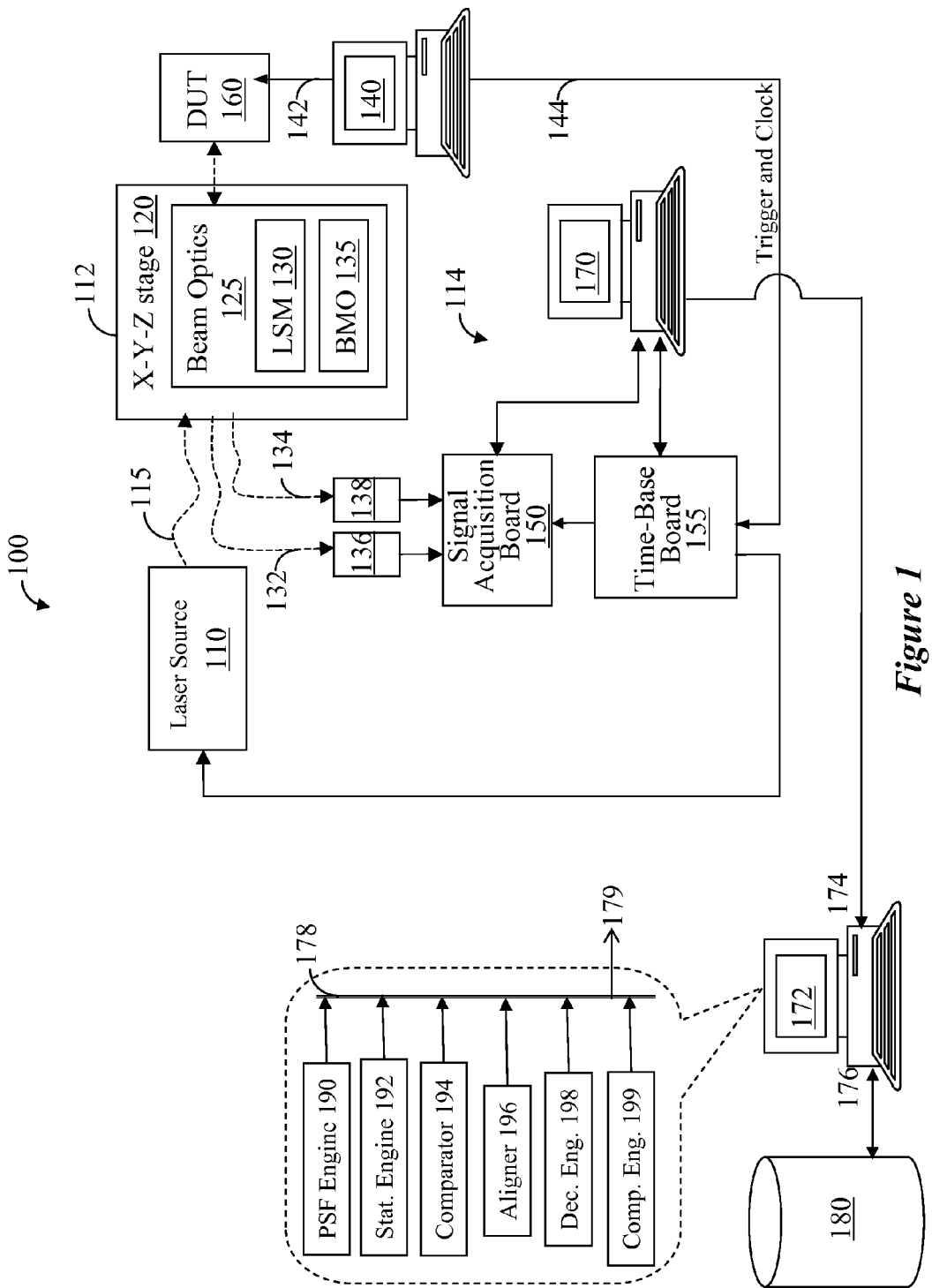
FIG. 1 is a schematic of a system for performing the alignment according to an embodiment of the invention.

Embodiments of the invention provide alignment of a DUT using the illuminated image of the chip. A synthetic image is created from the CAD database using several modeling parameters to account for the changes from the CAD to the actual layers as fabricated on the chip. Next the optical properties of the fabricated chip are modeled and then followed by model of the actual image generated inside the camera. When the actual image is taken, some layers will be in focus and some will not. This is modeled and applied to the synthetic image. Additionally, some layers are behind other layers, and will only be partially illuminated by the light transmitted thru the upper layers. The reflectance and transmittance of each layer are used as modeling parameters to further modify the synthetic image.

The modified synthetic image is compared against the actual illuminated image and a "difference image" is generated. A sum of squares of the pixel values of the difference image is calculated. The six values of the Translation Matrix, the emissivity and transmittance of each CAD layer, and other modeling parameters are adjusted to minimize the sum of squares of the difference image. The adjustment process is an iterative process using optimization techniques.

Partially due to the processing technologies involved and partially due to processing variations, the actual chip geometries will not exactly be the same as the CAD. Typically the actual metal line widths will be fatter or thinner than the CAD values. Also, because of photolithography processes corners are rounded and contacts, which are drawn in the CAD as small squares, will be circles on the actual chip. According to embodiments of the invention this can be modeled as a Gaussian point spread function with an unknown extent, and a threshold. The extent of the spread function and the threshold of each layer will be different and become parameters which will have to be adjusted during the optimization process.

The reflectance and transmission of each layer will be different and will also become parameter to be optimized. To simplify the process of iterative optimization, the layer optical reflectance, optical transmittance, and the width of the layers Gaussian spread function can first be calculated on a simple test structure. The optimization techniques for minimizing the "Difference Image" can flounder if too many variables are being adjusted. This tendency can be controlled by using good initial values from the test structures, and reducing the number of parameters being varied on the initial optimization, and get a first estimate of the Translation Matrix. On the second or subsequent pass more of the layer parameters can be allowed to vary. The various chip layers are also slightly misaligned during manufacturing, and this misalignment will also be modeled on the second or subsequent passes of the optimization process.

The manufacturing process also inserts "dummy geometries" in empty spaces which are not present on the CAD. These geometries are typically present on the metallization layers. According to embodiments of the invention, an exclusion zone is created on the Difference Image to ignore the results in the area where such "dummy geometries" are present.

The actual DUT image is often obtained using an IR camera from the backside of the DUT. The IR camera has a defined depth of focus and the objective is generally set to focus on the first layer from the back of the DUT. However, all the chip layers on the actual image will not be as sharp as the CAD layers. They will all be slightly blurred to the limitation of the objective lens. This is modeled by the Optical Point Spread Function of the Lens. This may be a Gaussian Function and will be a well defined spread, and will be known. However only one layer will be in best focus, and the other layers will be out of focus since the layers are comparable to the depth of focus of the Objective Lens. The further blurring of the Layers will also modeled by the out of focus point spread function which is a simple circular function, whose radius is proportional to the distance of the layer from the best focus plane, and the numerical aperture of the lens.

The final result provides the six parameter CAD to Chip Translation Matrix. This matrix will have the X-Y offset, and Theta rotation, between the Chip and CAD. It will also quantify the linear chip distortion induced by mechanical stresses. If the chip is subject to severe mechanical distortion, it is possible for the chip distortion to become non-linear. One way to model this is to use more variables in the Chip Translation Matrix. This will significantly increase the number of parameters which have to be optimized. The preferred way is to Weight the pixels in the centre of the image more heavily and still continue to use the linear six value Translation matrix. This will result in a poorer fit at the edge of the image, which is acceptable since the user cares more about the centre of the image.

FIG. 1 is a general schematic depicting major components of a system architecture, 100, and the aligner system according to an embodiment of the invention. In FIG. 1, dashed arrows represent optical path, while solid arrows represent electronic signal path. The optical paths are generally made using fiber optic cables. The probing part of the system comprises a laser source, 110, an optical bench 112, and data acquisition and analysis 114. The optical bench 112 includes provisions for mounting the DUT 160. A conventional ATE 140 can be used to provide stimulus signals 142 to the DUT 160, and trigger and clock signals, 144, to the probe controller 170 via time-base board 155. The time-base board 155 synchronizes the signal acquisition with the DUT stimulus and the laser pulses, if mode-locked laser is used for probing.

The output of the laser source 110 is transmitted to the optical bench 112 using fiber optics cable 115. The light beam is then manipulated by beam optics 125, which directs the light beam to illuminate selected parts of the DUT 160. The beam optics 125 may consist of a Laser Scanning Microscope (LSM 130) and beam manipulation optics (BMO 135). The specific elements that are conventional to such an optics setup, such as objective lens, etc., are not shown. Generally, BMO 135 consists of optical elements necessary to manipulate the beam to the required shape, focus, polarization, etc., while the LSM 130 consists of elements necessary for scanning the beam over a specified area of the DUT. The X-Y-Z stage 120 moves the beam optics 125 relative to the stationary DUT 160 or vice-versa. The light reflected from the DUT is collected by the beam optics 125 and is transmitted to two photodetectors 136, 138 via fiber optic cables 132, 134. The output signal of the photodetectors 132, 134 is sent to signal acquisition board 150, which, in turn, sends the signal to the controller 170. For imaging a simple IR camera can be used instead of the photodetectors.

According to one embodiment of the invention, the processing to align the image obtained by the acquisition system 114 is performed by a stand-alone system 172, which may be implemented in the form of specially programmed general purpose computer, or specifically constructed hardware and/or software and/or firmware. The acquired and conditioned image is sent from the processor 170 to the optical signal input 174 of the resolving system 172. The system 172 then obtains the CAD layout of the DUT from the CAD database 180, via CAD input 176. The system 172 then uses a computational engine (e.g., a microprocessor) to generate a synthetic image from the CAD layout and align the actual DUT image to the synthetic image. According to yet another embodiment, the system 172 is constructed integrally to the processor 170. In such a case, the CAD layout is provided from the CAD database 180 to the processor 170.

The callout in FIG. 1 illustrates an embodiment of the alignment system 172, whether it being a stand-alone system or integrally to the processor 170. The system 172 has a bus 178, to which various elements are coupled to communicate and provide signals to other elements. The optical signal input 174 and the CAD layout input 176 are connected to the bus 178 and provide the signal onto the bus. Also, an output 179 provides the output of the various calculations to, e.g., a monitor, a printer, etc. To enable the processing as described herein, the system 172 may include a point spread function generator 190 that generates the point spread functions to simulate, e.g., the optical performance of the image acquisition system, i.e., beam optics 125. A comparator 194 compares the synthetic image to the actual image from the optical signal obtained from the input 174. A decision engine or module 198 receives the outcome of various calculations performed by the various elements of the system 174 and provides an output for the alignment decision. A statistics engine or module 192 performs the various statistical calculations, such as the Chi-Square, Chi-distribution, F-distribution, etc. and provides the output to the decision engine 192. A CAD aligner 196 aligns the CAD layout synthetic image to the actual image and iteratively calculates error for various alignments until the smallest error is obtained, thereby selecting the best alignment coordinates. A computational engine 199, e.g., a microprocessor or a graphical processor, may be used to generate the synthetic image from the CAD.

Figure 2:
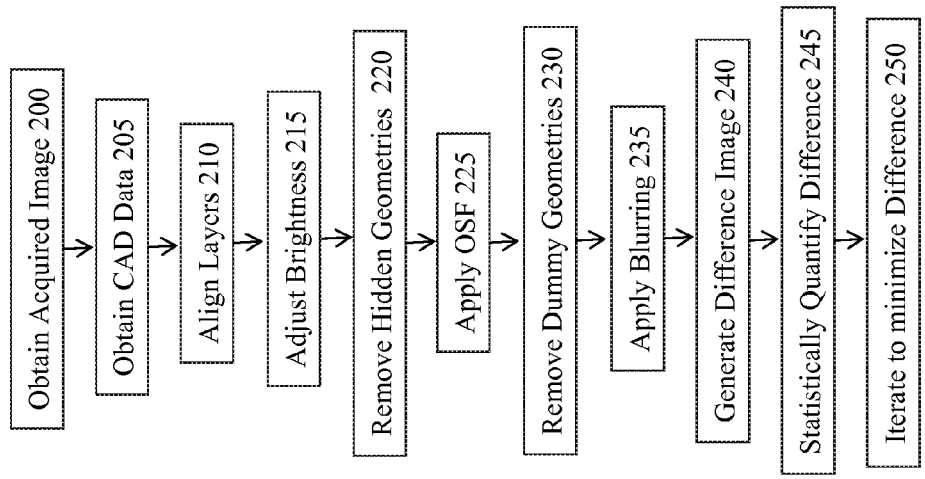
FIG. 2 is a flow chart of a process for performing the alignment according to an embodiment of the invention; the process may be performed using the system of FIG. 1.

FIG. 2 is a flow chart illustrating a process for performing the alignment according to an embodiment of the invention. The process of FIG. 2 may be performed using the system of FIG. 1 or other computing platforms. In step 200 the acquired optical image of the DUT is obtained and stored. In step 205 the CAD data corresponding to the DUT is fetched and stored. Each layer of the CAD data is then aligned in (x, y, θ, scale); i.e., in (x, y) translation, in θ rotation, and in scale (image magnification). In step 215 the brightness of each layer is adjusted. The adjustment of the brightness may be correlated to the layer's material and relative brightness of different materials can be set beforehand. For example, it can be set that the brightness of a polysilicon layer is 80% of the brightness of a metal layer. Also, limits on the variation of the brightness can be set beforehand. For example, it can be set that the brightness of a polysilicon layer can vary from 76%-84% of the brightness of a metal layer. This modeling may be based on the reflectance and transmittance of each layer, depending on the material makeup of the layer. This can also be studied empirically by fabricating test structures and using the relative brightness using empirical data.

In step 220 hidden layers are removed and the edges of transparent layers are indicated. In step 225 a point spread function operation is performed on each layer so as to simulate the transformation from the CAD design to the fabricated geometries. For example, the PSF can be applied to simulate the transformation of a square contact on the CAD design to a circular contact on the actual DUT. In this embodiment the PSF is applied to each layer independently with the extent and threshold being independent variables for each layer. The PSF can also be studied empirically and set using actual data obtained from a test structure.

At step 230 it is checked whether any "dummy" geometries were inserted in spaces indicated empty by the CAD design. If so, these areas are marked as an exclusion zone and will not be used during the alignment process. In step 235, a blurring process is applied to the CAD layers to simulate the image acquisition properties of the optical system, i.e., objective lens, used to acquire the actual image. The first layer is taken as being in focus, so that by applying a defined Gaussian function the first layer is blurred a bit to simulate actual imaging system. Additionally, further blurring is necessary to simulate the increasing out-of-focus blurring of successive layers. This can be modeled by applying a simple circular function to successive layers, wherein the radius of the function is proportional to the distance of the layer from the layer that is in focus and to the numerical aperture of the objective lens.

At step 240 the generated synthetic image is compared to the actual image and a difference image is generated. At step 245 a statistical operation is then performed on the difference image to statistically quantify the difference. For example, in one embodiment the sum of the squares of the pixel values of the difference image is calculated. Then, at step 250, an iterative process is performed so as to minimize the quantified difference. This is done by varying one or more of the values of the translation matrix (x, y, scale), the emissivity and the transmittance of each CAD layer. When the quantified difference is minimized, the resulting six parameters matrix will provide the x-y translation offset and theta rotation between the DUT image and the CAD image. Incidentally, this will also quantify the linear chip distortion induced by mechanical stress. If the chip is subjected to severe stress causing non-linear distortion, the number of parameters in the matrix can be increased to provide appropriate modeling. However, in order to control the number of parameters that need to be optimized, according to one embodiment the pixels in the center of the image are weighted more heavily, while using the above mentioned six-value matrix. While this may cause poorer fit at the edges of the image, the alignment using the center of the image would be sufficient. If the lighting of the image is very low there will be significant shot noise in the image. The shot noise will be proportional to the square root of the pixel intensity. In another embodiment a chi-square difference of the pixel values of the image will be computed and minimized using multiple iterations.

Figure 3:
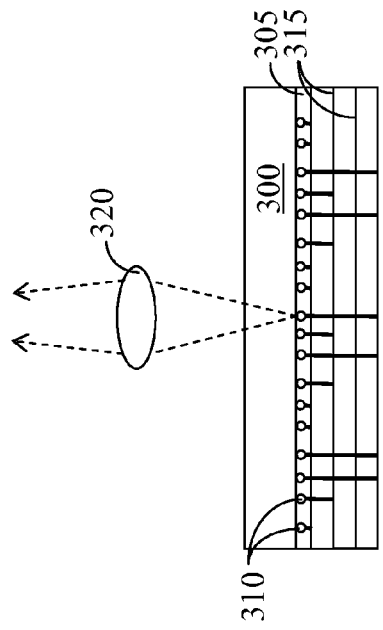
FIG. 3 illustrates a schematic representation of the DUT with an objective situated to collect emission from the backside of the DUT.

Turning back to the emission testing, as described in the above cited patent, emission testing is performed from the backside of the DUT. The backside of the DUT is generally thinned to, e.g., 150 microns, so as to enable collection of the faint emission from each transistor in the DUT. FIG. 3 provides a schematic representation of the DUT with an objective 320 situated to collect emission from the backside. In FIG. 3, layer 300 is the thinned silicon which served as the substrate for fabricating device layer 305. Elements 310 represent various transistors fabricated in device layer 305. Elements 315 are the various metallization layers forming the interconnect of the DUT. As shown, light emitted from a transistor propagates through the silicon layer 300 and is collected by the objective 320. This is the situation modeled in the above-cited patent.

However, a problem is noted wherein each emitting transistor is a point-source omni-radiator, meaning it emits light in all directions. Consequently, on various situations it happens that the light is radiated in a direction towards the interconnects, is then reflected by a metal line, and is then propagated through the silicon layer and is collected by the objective lens. Under such circumstances it is difficult to determine where the emission has originated from. The following embodiments enables modeling of such reflections to assist in determining the actual illumination.

FIG. 4 illustrate ray-tracing to enable understanding of the modeling. In FIG. 4 layer 400 is the thinned silicon layer having radiator 410 fabricated therein. Metal line 415 is fabricated in a dielectric layer 412 and extends above radiator 410, such that some of the light emitted by radiator 410 is reflected back by the metal line 415. This reflection is modeled by considering an imaginary radiator 425, corresponding to the actual radiator 410. This is similar to an imaginary image seen in a mirror. The ray tracing can be understood as follows. The dotted lines represent the ray tracing of the light emitted from radiator 410 and collected by objective lens 420 directly. This light is then projected onto the camera sensor plane 430, as the radiator 410 is at the focal plane of the objective. This will generate an intensity curve similar to the dotted line curve 545, shown in FIG. 5. On the other hand, the light emitted towards the metal line will be reflected back and collected by the objective as well, as shown by the broken-line ray tracing. However, the imaginary radiator 525 is not in the focal plane of the objective lens. Therefore, the objective will project the imaginary radiator 525 onto imaginary plane 535, which is out of focus from the camera sensor's perspective. Consequently, the image collected by the camera's sensor will be a cone of intensity approximated by the intensity curve 550 of FIG. 5. The two emissions will be additive on the camera sensor, which makes it even more complex to resolve the emission's location. Therefore, according to various embodiments, the direct emission and the reflection are modeled and are convolved together to identify the radiator's location.

According to one embodiment, the intensity of the reflection at each "chip pixel" by the "virtual image" at the image plane, i.e., the plane of the actual emission spot, is calculated because the objective lens is focused upon that plane. Since the actual emission point is supposed to emit equally in all directions, the virtual image will thus also emit isotropically. The reflection emission intensity will fall off as the square of the distance from the virtual emission point. The critical parameters are the distance of the pixel from the virtual point source and the angle "T" between the reflected ray and the vertical, i.e., the optical axis. The intensity at the image plane will have to be multiplied by the sine (T), to take into account the non-normal incidence. In addition the reflected image is further attenuated because the reflected light rays exit silicon 400, enter the dielectric 412, and then renter silicon 400. This attenuation is a function of "T", and the refractive indices of the silicon 400 and dielectric layer 412, and is calculated using standard optical formulas. The actual height of the virtual image will also have to be modified due to the difference of the refractive indices of silicon and the dielectric.

Reflected rays past a certain angle will not be collected by the objective lens 420. This collection angle is closely related to the numerical aperture of the objective lens 420. Reflected rays past the cutoff angle will not enter the objective lens, or will be blocked by the pupil or diaphragm inside the objective lens and not enter the camera. If the ray angle "T" exceeds the cutoff angle, rays beyond the cutoff angle are dropped from the calculations.

As a first approximation, the metal lines are taken to be infinite and cover the entire area above the radiating transistor. However, in practice the lines do not extend infinitely. Therefore, according to one embodiment, for each ray emanating from the virtual image to the pixel, it will be checked if it intersects the metal geometry as obtained from the CAD. If there is no intersection, the contribution at the pixel will be blanked since there is no reflected ray incident at the pixel.

For high K transistors which have metal gates, the attenuation of the light going through the metal gate may also have to be calculated.

Once the reflected image intensity at the image plane is calculated, it may be convolved with the point spread function of the objective lens to obtain the image intensity at the pixel in the camera. Then, it can either be subtracted from the obtained image so as to remove the contribution of the metal line reflection, or it can be simply convolved with the point spread function of the direct image to completely simulate the direct image together with the reflected image.

The above sequence of steps allows the calculation of each virtual image point. There will be multiple virtual images since the overlying metal and the silicon surface act as a parallel set of mirrors giving an infinite number of virtual images. However there is significant attenuation at the silicon dielectric interface with each virtual image, and only a few virtual images will be enough.

An alternate approach to calculate the reflected image intensity at the plane of the emission point is to view the reflected rays as an "out of focus" virtual image, and thus calculate the intensity of such an out of focus image at the camera pixels. A standard "out of focus point spreading expression" or software routines can be employed. The calculation of the signal attenuation at the silicon/dielectric interface for different angles will still need to be performed.

Figure 6:
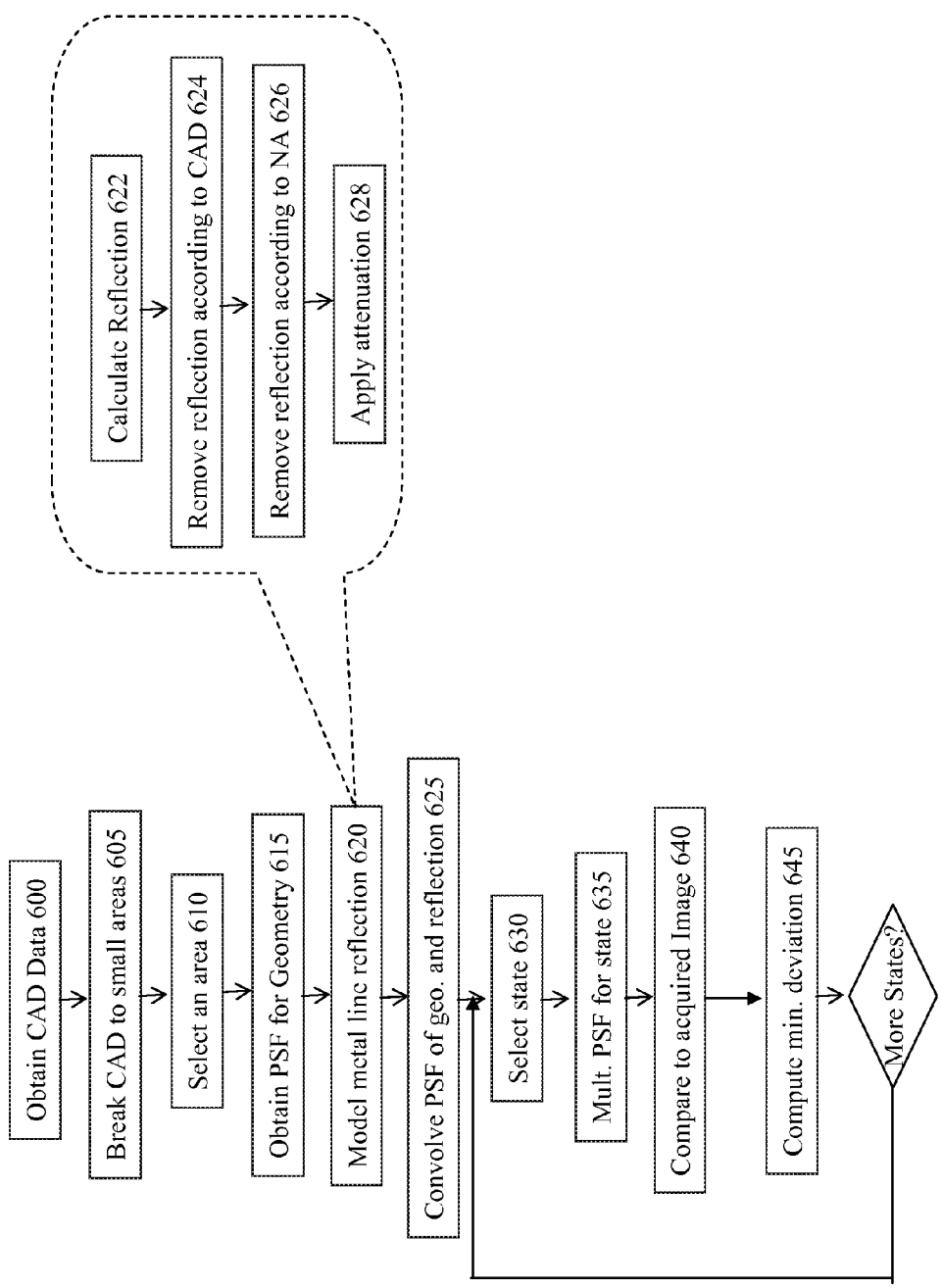
FIG. 6 depicts a flow chart for a process according to one embodiment to resolve the emission, including modeling for metal line reflection.

FIG. 6 depicts a flow chart for a process according to one embodiment to resolve the emission, including modeling for metal line reflection. The process begins at Step 600 where the CAD design of the area under investigation is obtained. When the area of the chip includes clusters of closely spaced transistors, in Step 605 the area is broken to smaller, more manageable areas along these clusters. An area for testing is selected in Step 610 and for each selected area the transistors are identified and the list of possible states is assembled. Notably, by breaking the area into smaller clusters, the number of states that the system needs to consider in the calculations is reduced. The maximum size of the clusters, i.e., the maximum number of transistors within a cluster, can be determined according to the processing power of the system.

At Step 615 the point spread function (PSF) is calculated for the geometry of the devices in the area selected in Step 610. Alternatively, the PSF for all of the various device geometries can be calculated beforehand so as to build a PSF library. In such a case, at Step 615 a proper PSF corresponding to the geometry of the area selected in Step 610 is selected in Step 615 from the library. In step 620 the reflections for the selected geometry are calculated and in step 625 the PSF of the calculated reflections are convolved with the PSF of the selected geometry to obtain a complete PSF.

At Step 630 a state is selected and at Step 635 the complete PSF is multiplied by the selected state. For example, if the area selected has three transistors aligned in a single line, for the first state the PSF will be multiplied by (0,0,0), for the second state by (1,0,0), etc., to cover all emission possibilities.

The resulting calculated PSF is then compared to the measured signal in Step 640 and at Step 945, the minimum deviation is calculated. For this step, any known method for calculating the deviation between the two curves may be used. For example, the known least square or ordinary least square method may be used to obtain the best curve fit and the minimum residual set as the minimum deviation. The least square method assumes that errors are randomly distributed. However, according to one embodiment of the invention, the noise level is assumed not to be randomly distributed, but rather correlated to the intensity value itself. For example, the error of each measured data point may be assumed to equal to the square root of the measured data point, i.e., the intensity I at each point may equal I+/− √I. Therefore, according to one embodiment, the Chi Square analysis is used instead. Generally, the Chi Square used in this embodiment is in the form $(I_M - I_E)^2/N$, where $I_M$ is the measured intensity and $I_E$ is the expected intensity (i.e., PSF), and N is the noise squared ($N = I_E + n^2$, where n is the sensing noise). To obtain the deviation, a summation is performed over the number of sampled points: $tChiSq = \Sigma (I_M - I_E)^2/N$. As can be understood, the number of sampled points can be varied to provide fine or coarse approximation, as required by the particular application.

As shown in FIG. 6, modeling the reflections may be done in one embodiment by following the steps listed in the callout. At step 632 the reflections from all devices within the selected area are calculated using the approximation of infinite metal lines. At step 634 the CAD design is used to determine the actual extent of each metal line within the selected area and the calculated reflections are trimmed according to the CAD design. That is, calculated reflections that do not intersect a metal line in the CAD design are removed. In step 636 calculated reflections that pass beyond the numerical aperture of the lens (or iris of the optical system) are removed. At step 638 attenuation is applied to the modeled reflected light. The attenuation may be one or more of: correction due to angle of incidence (i.e., multiply by sine (T)), correction due to changes in the refractive indices of the materials in which the light travels, attenuation due to collection efficiency of the optical system, etc.

It should be understood that processes and techniques described herein are not inherently related to any particular apparatus and may be implemented by any suitable combination of components. Further, various types of general purpose devices may be used in accordance with the teachings described herein. It may also prove advantageous to construct specialized apparatus to perform the method steps described herein.

The terms and expressions used in describing the embodiments were employed for the purpose of description and not limitation, such that their use is not intended as excluding any equivalents or alternatives.

The present invention has been described in relation to particular examples, which are intended in all respects to be illustrative rather than restrictive. Those skilled in the art will appreciate that other implementations of the invention will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A computerized method for orienting an image of an integrated circuit device under test (DUT) using a computing system, comprising:
    obtaining an optical image of the DUT from an optical system;
    obtaining a computer aided design (CAD) data having a plurality of CAD layers of the DUT;
    operating on each of the CAD layers to generate a synthetic image simulating an optical image of the CAD layer;
    constructing a CAD image of the DUT by overlaying the synthetic images of the CAD layers;
    generating a difference image by comparing the optical image to the synthetic image;
    varying parameters of each CAD layer of the synthetic image so as to minimize the difference image by, for each of the plurality of CAD layers:
        aligning each layer to the optical image in translation, rotation, and image magnification;
        adjusting brightness, emissivity and transmittance values of each layer; and,
        indicating edges of transparent layers.

2. The method of claim 1, wherein varying the parameters further comprises varying a global brightness of the synthetic image.

3. The method of claim 2, wherein relative brightness value of each layer is predetermined and wherein the brightness value of each layer is variable on within a redetermined brightness range.

4. The method of claim 1, wherein generating the synthetic image comprises removing hidden geometries for each layer.

5. The method of claim 1, wherein generating the synthetic image comprises applying optical point spread function to each layer so as to simulate the transformation from the CAD design to the fabricated geometries.

6. The method of claim 1, wherein generating the synthetic image comprises removing dummy geometries.

7. The method of claim 1, wherein generating the synthetic image comprises applying blurring to selected layers so as to simulate the image acquisition properties of the optical system.

8. The method of claim 1, further comprising performing a statistical operation on the difference image to statistically quantify the difference image.

9. The method of claim 8, wherein the statistical operation comprises calculating at least one of sum of the squares and Chi-square values of each pixel value of the difference image.

10. The method of claim 9, wherein minimizing the difference image comprises minimizing at least one of the sum of the squares and Chi-square values of each pixel value of the difference image.

11. The method of claim 1, further comprising:
selecting an area of the DUT to be resolved;
for each active device in the selected area calculating a metal line emission reflection;
applying attenuation to each calculated metal line emission reflection.

12. The method of claim 11, wherein applying attenuation comprises one or more of:
applying correction to simulate intensity changes due to angle of incidence of the metal line emission reflection with respect to the optical axis;
applying correction to simulate intensity changes due to changes in refractive indices of materials in which the metal line emission reflection travels; and,
applying attenuation to simulate intensity changes due to collection efficiency of an optical system.

13. The method of claim 12, further comprising using the CAD data to trace each metal line emission reflection and removing each metal line emission reflection that does not intersect a metal line indicated in at least one layer of the CAD data.

14. The method of claim 12, further comprising tracing each metal line emission reflection and removing each metal line emission reflection that does not pass within a prescribed numerical aperture of the optical system.

15. The method of claim 12, wherein applying attenuation comprises applying a point spread function of the optical system.

16. The method of claim 1, wherein parameters of pixels in central area of the synthetic image are weighted heavier than other pixels.

* * * * *